(12) United States Patent
Mouser et al.

(10) Patent No.: US 6,231,684 B1
(45) Date of Patent: May 15, 2001

(54) APPARATUS AND METHOD FOR PRECISION CLEANING AND DRYING SYSTEMS

(75) Inventors: Wayne Mouser; Randy Honeck, both of Maple Grove; Matthew Bartell, Waconia, all of MN (US)

(73) Assignee: Forward Technology Industries, Inc., Minneapolis, MN (US)

( * ) Notice: Subject to any disclaimer, the term of this patent is extended or adjusted under 35 U.S.C. 154(b) by 0 days.

(21) Appl. No.: 09/393,781

(22) Filed: Sep. 10, 1999

Related U.S. Application Data
(60) Provisional application No. 60/099,953, filed on Sep. 11, 1998.

(51) Int. Cl.[7] ................................................ B08B 7/04
(52) U.S. Cl. ............................ 134/30; 134/83; 134/105
(58) Field of Search ............................ 134/61, 82, 83, 134/135, 164, 105, 108, 11, 12, 30, 31; 202/170

(56) References Cited

U.S. PATENT DOCUMENTS

| | | |
|---|---|---|
| 4,485,761 | 12/1984 | Stewart . |
| 4,558,524 * | 12/1985 | Peck et al. ................... 134/105 X |
| 4,736,758 * | 4/1988 | Kusuhara ................... 134/105 X |
| 4,902,350 * | 2/1990 | Steck ................... 134/135 X |
| 4,983,223 * | 1/1991 | Gessner ................... 134/105 X |

FOREIGN PATENT DOCUMENTS

2024363 * 1/1980 (GB) ................... 134/82

* cited by examiner

*Primary Examiner*—Philip R. Coe
(74) *Attorney, Agent, or Firm*—Patterson, Thuente, Skaar & Christensen, PA

(57) ABSTRACT

A chamber having selectable and controllable access through which a process part is placed within and removed from a processing system. The chamber is designed to selectively isolate the external and internal environments of the process system during delivery and removal of the process part.

20 Claims, 5 Drawing Sheets

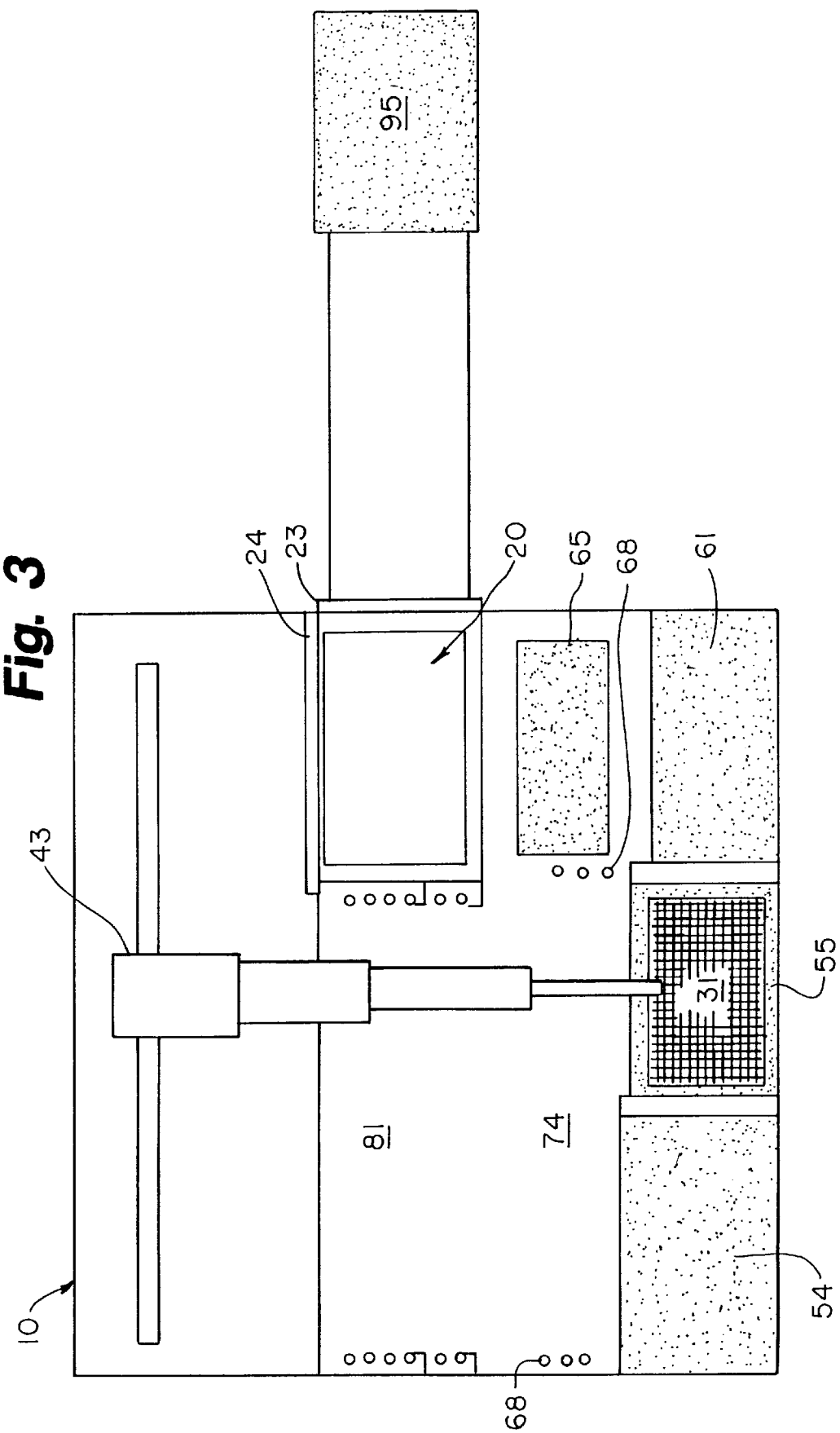

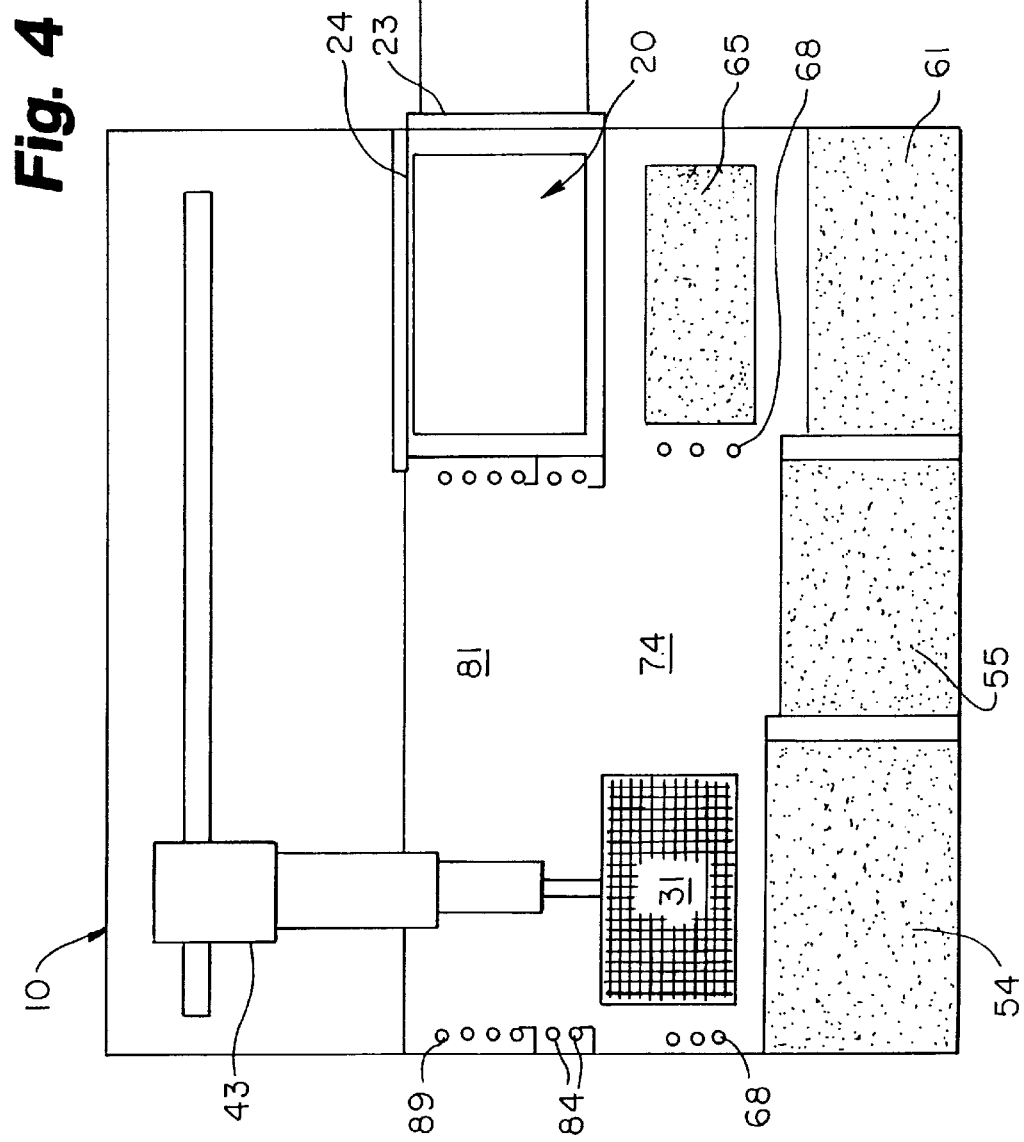

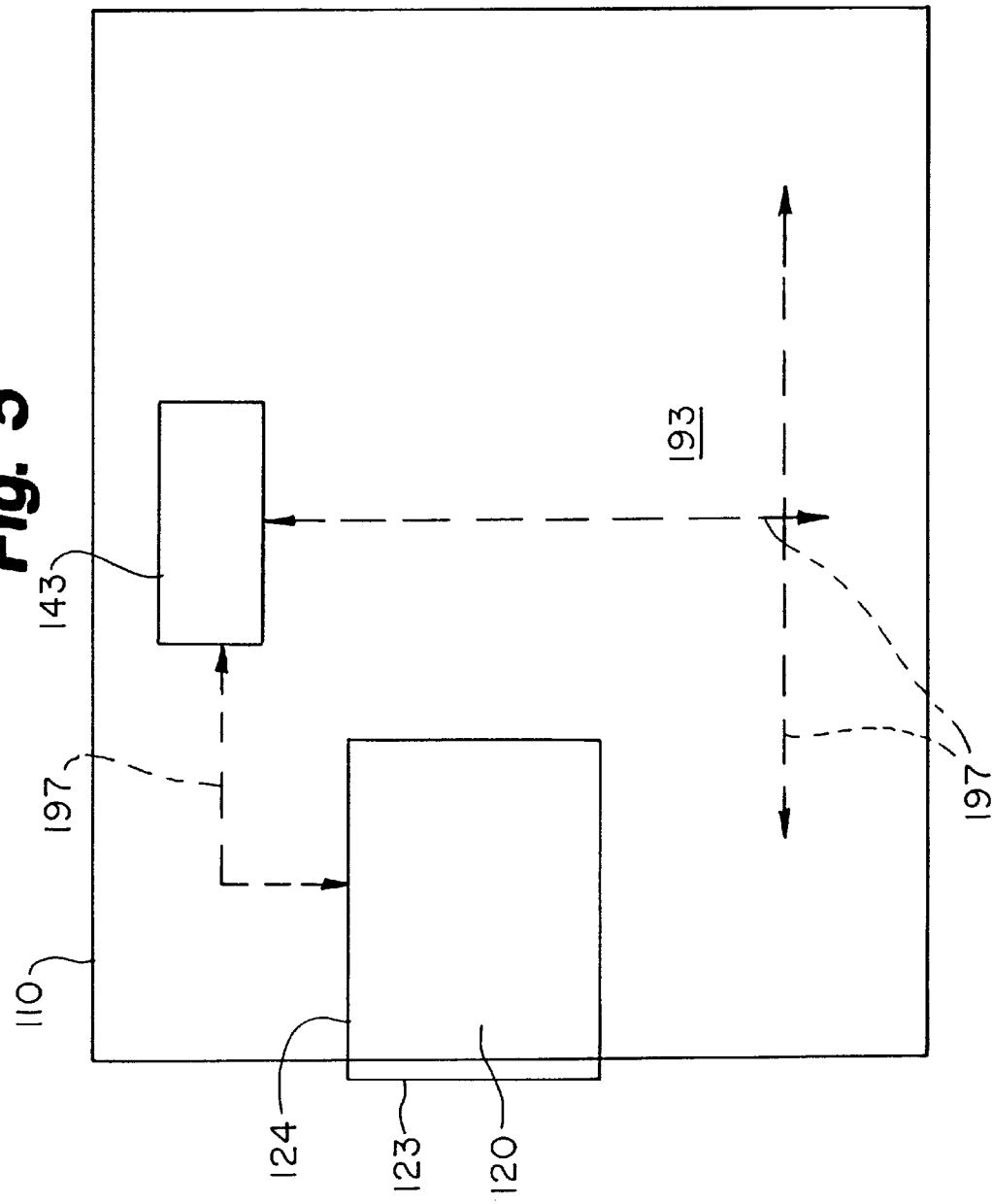

APPARATUS AND METHOD FOR PRECISION CLEANING AND DRYING SYSTEMS

This application claims benefit to U.S. provisional application serial no. 60/099,953 filed Sep. 11, 1998.

FIELD OF THE INVENTION

The present invention generally pertains to process part precision cleaning and drying apparatus and methods. Specifically, the invention relates to cleaning and drying systems using a wide variety of solvents or liquids and implements various cooperative structures and processes to reduce solvent or other cleaning material consumption while enhancing cleaning and drying efficiencies of the systems.

BACKGROUND OF THE INVENTION

Cleaning systems utilize solvents or other aqueous mixtures for cleaning and drying of process parts. Most of the currently available systems are uneconomical because they lack adequate means for controlling solvent carry-off and evaporation. Typically, this results in high solvent consumption and energy dissipation in addition to undesirable emissions and discharge into the environment.

Additional concerns relate to loss of other cleaning system fluids or materials, whether solvent-based or not. In these systems there is a similar need to obviate such losses.

Accordingly, there is a need for an energy efficient and environmentally sound system to clean and dry process parts.

SUMMARY OF THE INVENTION

The present invention provides a structure and process to precisely and efficiently clean and dry process parts. The system is preferably designed for use with universally accepted cleaning solvents including but not limited to HFCs, HCFCs, HFEs, PFCs and other non-CFC, non-flammable solvents and low flash point solvents such as isopropyl alcohol and cyclohexane, although non-solvent uses apply as well. The system combines unique structural, mechanical and electronic components integrated with Programmable Logic Controllers (PLCs) and processes to provide a distinct advantage over the prior art.

The system is adapted for cleaning and drying and removal of contaminants from various process parts. For example, contaminants from PC boards, hybrid circuits, MCMs, C4 packages, disk drive components, precision mechanical and electromechanical components, optical instruments and medical devices may be effectively removed using the present invention.

Specifically, the present invention not only enables the use of a wide range of different solvents but also reduces cleaning and drying media consumption through the use of a full sealed upper enclosure and a highly specialized chamber known as the LOAD LOCK™ chamber or LOAD-LOCK™ process.

In one embodiment, Isopropyl alcohol (IPA) is used for the removal of water, particle contamination and organic films including oils and greases. In yet another embodiment cyclohexane is used to remove particle contamination and organic films including oils and greases. Further, in another embodiment alcohol/cyclohexane azeotrope is used to remove most contaminants including activated fluxes. In yet another embodiment, solvents such as n Pb, and many of the new CFC-replacing solvents-, along with acetone and volatile methyl siloxanes may be used. Alternate embodiments include systems useful as vapor dryers and wet benches, for example.

BRIEF DESCRIPTION OF THE DRAWINGS

In the drawings in which like numerals describe substantially similar components throughout the several views:

FIG. 3 is a schematic view of the invention depicting a stage at which the process part is being processed prior to removal through the chamber FIG. 4 is a schematic view of the invention depicting a stage at which the process part is exposed to superheat and subsequently removed via the isolatable loading chamber.

FIG. 5 is a schematic view of the invention in use with another embodiment cleaning, drying, or process system.

DETAILED DESCRIPTION OF THE INVENTION

The present invention provides a highly efficient precision cleaning and/or drying, and/or process system which greatly reduces unwanted emissions from the system.

Additional aspects of the invention may include low flashpoint compatible wiring practices, $co_2$ fire detection and suppression system, PLC and graphic interface, a precision telescoping system for process part transport, indirect hot water heating system, sealed upper enclosure and load lock, vertical basket oscillation, parallel basket processing and co-solvent operation compatibility. Further, the present invention incorporates special features which include, but are not limited to, ultrasonic systems; filtered recirculation to filter deposits and contaminants from solvent streams; distillate spray; spray under immersion and carbon adsorption emission abatement package. It is recognized, however, that these and other features are optional, and non-essential to the invention.

The system implements a fully sealed top enclosure which minimizes vapor zone disturbance and subsequent solvent losses due to downdrafts or cross-room air flow. The enclosure also ensures that particulate from other production areas do not enter the system. Moreover, a loadlock™ chamber allows insertion and removal of parts and further augments containment of solvent vapors. As can be seen, this system has elements quite useful to wetbench applications, aqueous cleaning systems, alcohol vapor dryers, or other cleaning/drying systems.

Figure 1:
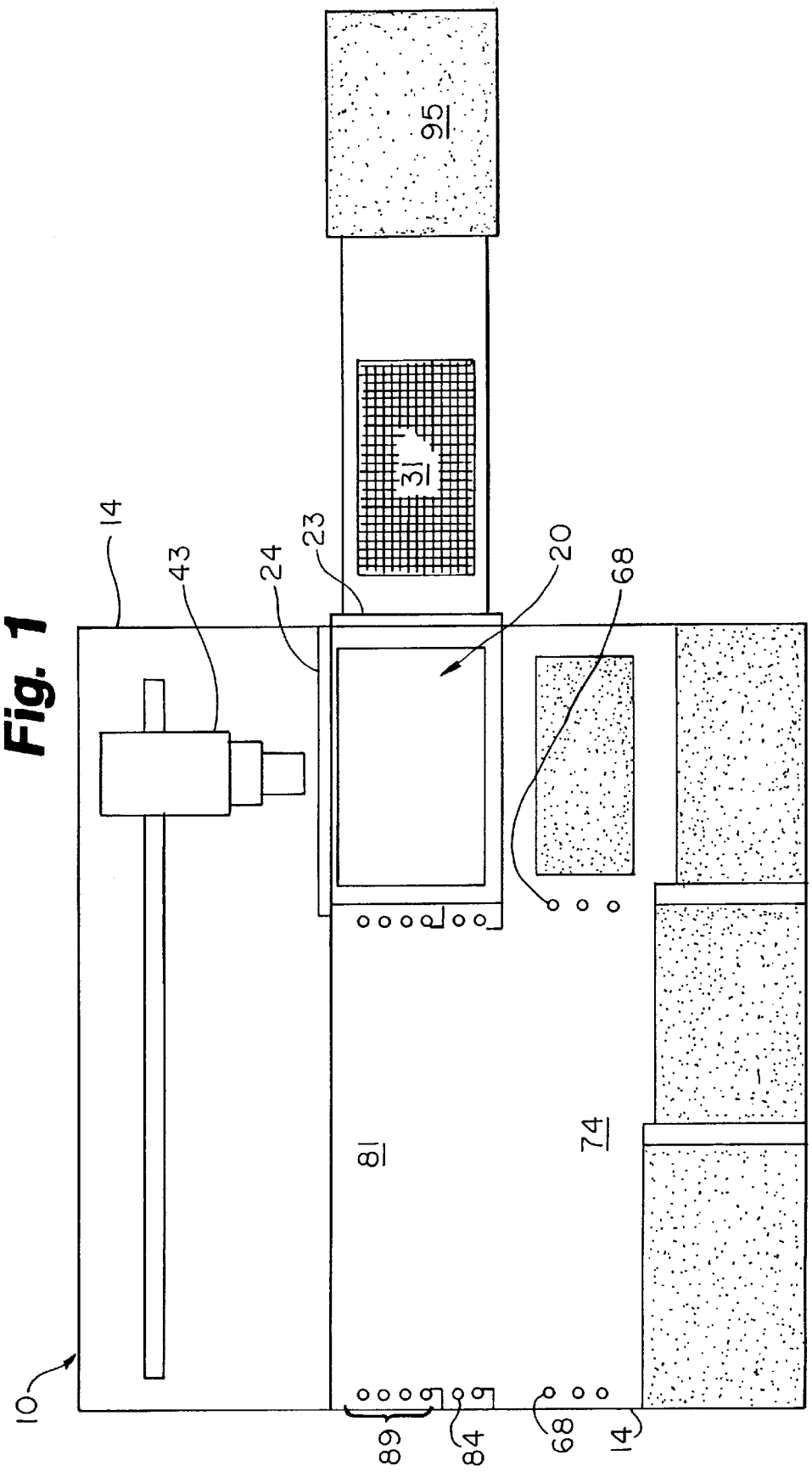
FIG. 1 is a schematic elevation view of the present invention utilized in one embodiment of a cleaning or drying system.
Figure 2:
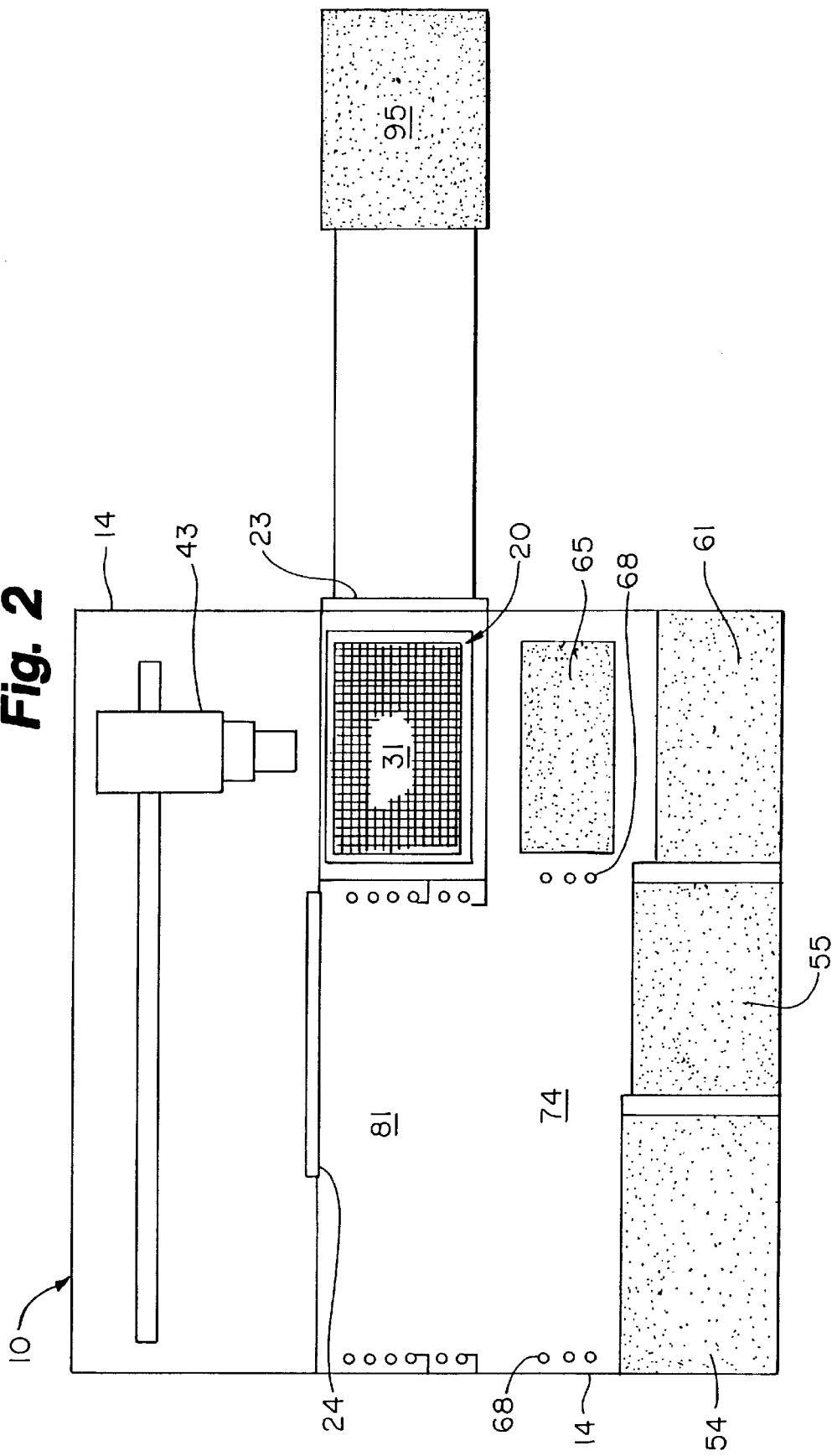
FIG. 2 is a schematic elevation view of the invention depicting the initial stages of the process of operation, using the system of FIG. 1.

FIG. 1 is a schematic illustration of one embodiment of a processing system, in this instance a cleaning system 10 utilizing features of the present invention. It is recognized that various aspects of the invention may be utilized in various types of processing systems, including precision cleaning or drying systems, for example solvent cleaning systems, wet bench cleaning systems, and others. The embodiment of processing system illustrated generally in FIG. 1 is that of a solvent precision cleaning system, such as that manufactured and sold by Forward Technology, Inc., Minneapolis, Minnesota, under the tradename SA-Series™. Cleaning system 10 generally comprises sealable outer enclosure 14 configured with various enclosures and zones therein. One aspect of the invention includes an improved access chamber, generally depicted as chamber 20, which allows for excellent part insertion and removal with virtually no vapor emission or operator exposure. Chamber 20 comprises access closure means, such as closure doors or panels, shown in FIG. 1 as outer closure door 23 and inner closure door 24. These closure doors are designed to permit a part 31 which is to be cleaned to enter cleaning system 10 through outer closure door 23 while inner closure door 24 remains closed, thus sealing the internal volume of cleaning system 10 from exposure to the outside atmosphere. Once part 31 has been placed within chamber 20, then outer closure door 23 is closed and after sealing is effected then further system operation may commence. At commencement, inner closure door 24 may then be opened, when ready, and the part removed by operation of a transport device, shown here as optional automated transport device 43. The commencement of this operational sequence is depicted in FIG. 2, where inner closure door 24 has been opened after closure and sealing of outer closure door 23. In one embodiment, transport device 43 is shown as an optional telescoping transport device having features that allow automatic operation that is coordinated with the operation of the closure means for chamber 20. For example, in order to minimize the exposure of either the outer atmosphere to the inner volume of cleaning system 10 or alternatively to minimize the exposure of the inner volume of cleaning system 10 to the outer atmosphere, it is helpful in certain embodiments to provide a programmable logic controller system for automatically engaging and transporting part 31 from chamber 20 throughout the entire cleaning cycle. This permits exceptionally efficient loading and unloading of part 31, which is particularly important to maintaining the efficiency of operation of the system. Efficiency in this context relates to thermal, mechanical, environmental, time, and other efficiencies. This will be further discussed below in the context of the exemplary components of this particular cleaning system 10 but is relevant to other types of cleaning systems in which a chamber construction and chamber closure means such as disclosed herein are utilized to similar advantage.

As shown in FIGS. 1 and 2, part 31 is placed within chamber 20 and then appropriately removed from chamber 20 by a transport device 43. Transport device, such as mobile telescoping transport device 43, then takes part 31 to the appropriate position for cleaning and/or drying within system 10. As illustrated, this particular cleaning system comprises a plurality of process sumps 54, 55, although it is recognized that one or none of these sumps may be required according to the particular cleaning, drying, or other type of process system utilized. Regardless, in this embodiment of cleaning system 10, boil sump 61 provides a location for which the dirtiest solvent is concentrated, and which is never a location that any of the parts, such as part 31, enters. As shown, boil sump 61 generates heat, which is augmented by superheater subsystem 65 and optional vapor zone heating coils 68. Thus is formed a superheated vapor zone generally depicted at 74, shown in FIGS. 14, into which part 31 is brought following immersion in one or more process sumps 54, 55. This step in the process is depicted in FIG. 3. It is recognized that part 31 is first cleaned in some manner in the immersion or solvent sump, such as by oscillation or ultrasonics or other means, and then part 31 is raised through superheated vapor zone 74 and into free board zone 81, as shown in the process step depicted in FIG. 4.

Condensing coils 84 and subzero freeboard cooling coils 89 provide further control mechanisms to facilitate the vaporization, condensation, and reheating of the solvent throughout the system. This process, known as the reflux cycle, ensures that the solvent is removed from part 31 and the part is properly cleaned prior to its removal from the system. In a solvent cleaning system, as in certain other types of systems, it is quite important to maintain the various zones of temperature within the system without uncontrolled collapse or expansion. The alternative results in a cleaning system that will not adequately clean any parts placed therein. Therefore, it is particularly important that part 31 may be loaded and unloaded from system 10 while maintaining a vapor or pressure lock of the internal chamber within the bounds of sealable outer enclosure 14, as described above. Similarly, this sealable feature of the closure means of the invention, for example closure doors 23 and 24 and the mechanisms by which they interface with the rest of cleaning system 10, prevents inappropriate loss of cleaning fluids and heat from, or introduction of impurities into the system. This results in greater system efficiencies, higher reflux rates, and improved cleaning and drying, as appropriate.

FIG. 5 discloses system 110, which incorporates the invention described herein. System 110 is representative of a generic processing system designed for cleaning, drying, or other processing of processed parts in which the process itself requires or is advantaged by a closed system. In this example of use of the invention, chamber 120 is shown through which one or more processed parts are delivered into and delivered from the internal portions of system 110. Once again, the invention comprises use of a process and structure designed to isolate the internal and external environments relative to structure 110. Accordingly, chamber 120 is accessed and isolated through use of outer closure door or mechanism 123 and inner closure door or mechanism 124. In this example, transport device or mechanism 143 inter-operates with chamber 120 to enable movement of a process part into the chamber, and out of the chamber into process zone 193 within system 110. Approximate movements of transport device 143 are depicted schematically by broken lines 197. It is recognized that numerous different processing systems and methods may be advantageously affected by use of the invention described herein.

Numerous other optional features are present in the invention's various embodiments. For example, transport device 43, has shown comprises telescoping mobile transport device. In addition to a substantial load capacity and variable speed operation, transport device 43 may also be operated utilizing automated lift controls which regulate the rate of part travel through the vapor zone to insure adequate drying and minimal solvent dragout. In this instance, automatic operation insures ease of use and no operator exposure. Another optional feature includes controlled boosting of the temperature at superheater 65 during any load or unload sequence of part 31 via chamber 20. An augmenting abatement system 95 may also be utilized with the invention, although it is not necessary. System 95 is designed to isolate, evacuate or further mitigate any undesired emissions either from exiting or entering system 10 via chamber 20.

What is claimed is:

1. In a system for process part precision processing, a chamber mechanism operating, in cooperation with a transport device, to minimize processing material vapor carry-off and disturbance of an air-vapor interface, or introduction of external impurities, the chamber mechanism comprising:

an enclosure having an outer and an inner access door, wherein the outer access door is located at or below the air-vapor interface, wherein the inner access door is located above the air-vapor interface;

control means for operating said outer and inner access doors;

means for maintaining atmospheric volume within said enclosure at one of a condition when one of said outer and inner access doors are open and when both of said outer and inner access doors are closed; and said outer and inner access doors being independently and jointly operable to enable insertion and removal of a process part from said enclosure and further to enable the transport device to convey the process part to and from said enclosure.

2. The system of claim 1 in which the transport device and outer and inner access doors are automatically, functionally automated and synchronized in operation.

3. The system of claim 1 in which the system is a solvent cleaning and drying system.

4. The system of claim 1 in which the system is a non-solvent based cleaning and drying system.

5. The system of claim 1 further comprising temperature control means for optional adjustment of the temperature within a portion of the system during operation of either the outer or inner access doors.

6. The system of claim 1 in which the transport device comprises a telescoping component.

7. A method for controlling disturbance of an air-vapor interface in a parts processing mechanism in which a part is placed into the mechanism for processing and removed therefrom upon cleaning or drying, the method comprising the steps of:

a. providing a parts processing mechanism with internal means for cleaning and drying a process part;

b. providing a transport mechanism within the parts processing mechanism for receiving and transporting a process part through a cleaning and drying process;

c. providing chamber isolation means for allowing placement of a process part into and removal from the process mechanism during operation in a manner that maintains a desired air and vapor interface within the process mechanism;

d. moving the process part into the chamber isolation means through an outer door that is located at or below the air-vapor interface; and e. moving the process part from the chamber isolation means to the parts processing mechanism with the transport mechanism by passing the process part through an inner door that is located above the air-vapor interface.

8. The method of claim 7 in which the chamber isolation means arranging comprises placing the inner door and the outer door in relation to a process part receiving chamber to effectively and selectively isolate the chamber from both the internal volume of the process mechanism and the environment external of the process mechanism.

9. The method of claim 8 wherein the operation of the inner door, outer door, and transport mechanism are controlled by automated steps and mechanisms.

10. A method for controlling disturbance of an air-vapor interface in a parts processing mechanism in which a part is placed into the mechanism for processing and removed therefrom upon cleaning or drying, the method comprising the steps of:

providing a parts processing mechanism having a receiving region, a cleaning region, a drying region and a solvent condensation region therein, wherein the receiving region has an outer closure door and an inner closure door, wherein the parts processing mechanism is substantially enclosed such that process parts can only be moved into and out of the parts processing mechanism through the receiving region;

moving a process part into the receiving region through the outer closure door, wherein the outer closure door is located at or below the air-vapor interface;

moving the process part from the receiving region to the cleaning region through the inner closure door, wherein the inner closure door is located above the air-vapor interface; and controlling the operation of the outer closure door and the inner closure door so that at most one of the outer closure door and the inner closure door is open simultaneously.

11. The method of claim 10, wherein the air-vapor interface is defined by at least one coil, which has a fluid passing therethrough that is at a temperature below a condensation temperature of a cleaning fluid used in the cleaning region.

12. The method of claim 10, wherein the drying region is located between the cleaning region and the air-vapor interface.

13. The method of claim 10, wherein the inner closure door and an outer closure door effectively and selectively isolate the receiving region from both an internal volume of the parts processing mechanism and an environment external to the parts processing mechanism.

14. The method of claim 13, and further comprising providing a transport mechanism within the parts processing mechanism for receiving and transporting a process part through a cleaning and drying process.

15. The method of claim 14, wherein the operation of the inner closure door, outer closure door, and transport mechanism are controlled by automated steps and mechanisms.

16. In a system for process part precision processing, a chamber mechanism operating, in cooperation with a transport device, to minimize processing material vapor carry-off and disturbance of an air-vapor interface, or introduction of external impurities, the chamber mechanism comprising:

a chamber including an inner closure door positioned at or above the air-vapor interface and an outer closure door that is positioned at or below the air-vapor interface; and one or more logic controllers which coordinate the movement of the transport device, inner closure door, and outer closure door; said logic controllers further control and maintain atmospheric volume within said enclosure when one of said inner closure door or outer closure door is open and when both of said inner closure door and outer closure door are closed.

17. The parts processing system of claim 16 wherein the inner closure door is located above a vapor line and the outer closure door is located at least partially below the vapor line; said vapor line is positioned between a vapor zone and a freeborn zone.

18. The parts processing system of claim 16, wherein the transport device and inner and outer doors are automatically, functionally automated and synchronized in operation.

19. The parts processing system of claim 16 wherein the logic controller facilitates adjustment of temperature within a portion of the system during operation of either the inner or outer doors.

20. The parts processing system of claim 16, wherein the transport device comprises a telescoping component.

* * * * *